United States Patent
Kim et al.

(10) Patent No.: US 7,584,323 B2
(45) Date of Patent: Sep. 1, 2009

(54) METHOD OF GENERATING TCAM ENTRY AND METHOD AND APPARATUS FOR SEARCHING FOR TCAM ENTRY

(75) Inventors: Young Ho Kim, Daejeon (KR); Bo Heung Chung, Daejeon (KR); Jae Deok Lim, Daejeon (KR); Seung Ho Ryu, Seoul (KR); Yong Sung Jeon, Daejeon (KR); Sang Woo Lee, Daejeon (KR); Ki Young Kim, Daejeon (KR)

(73) Assignee: Electronic and Telecommunications Research Institute, Daejeon (KR)

( * ) Notice: Subject to any disclaimer, the term of this patent is extended or adjusted under 35 U.S.C. 154(b) by 294 days.

(21) Appl. No.: 11/583,189

(22) Filed: Oct. 18, 2006

(65) Prior Publication Data

US 2007/0094441 A1    Apr. 26, 2007

(30) Foreign Application Priority Data

Oct. 26, 2005    (KR)    ...................... 10-2005-0101350

(51) Int. Cl.
G06F 12/00 (2006.01)
(52) U.S. Cl. ..................................................... 711/108
(58) Field of Classification Search .................. None
See application file for complete search history.

(56) References Cited

U.S. PATENT DOCUMENTS 6,717,946 B1 * 4/2004 Hariguchi et al. ........... 370/392

OTHER PUBLICATIONS

Schwartz, Randal L. et al, Learning Perl, Jul. 2005, O'Reilley Media, 4th Edition, Sections 2.2.3 and 13.2.*

* cited by examiner

Primary Examiner—Reginald G Bragdon
Assistant Examiner—Eric Loonan
(74) Attorney, Agent, or Firm—Blakely, Sokoloff, Taylor & Zafman LLP

(57) ABSTRACT

Provided is a method of generating and searching for a single ternary content addressable memory (TCAM) entry for range search and exact-match search. First, it is determined whether an entry to be added is a range search entry or an exact-match search entry. When the entry is the range search entry, a bit at a predetermined position in the upper m bits corresponding to a range represented by the entry is set to "1" and the remaining bits including lower n bits is set to a "don't care" bit x, based on a range table for representing position information of one of the upper m bits which is set to "1" in ranges. When the entry is the exact-match search entry, the upper m bits is set to "don't care" bit x and the lower n bits is set to the entry value. By generating and searching for a single TCAM entry for a range search and an exact-match search, a space for storing the TCAM entry can be optimized and efficiency thereof can be improved.

7 Claims, 8 Drawing Sheets

TCAM ENTRY

RANGE TABLE

RANGE TABLE

RANGE CONVERSION TABLE

RANGE CONVERSION TABLE

METHOD OF GENERATING TCAM ENTRY AND METHOD AND APPARATUS FOR SEARCHING FOR TCAM ENTRY

This application claims the benefit of Korean Patent Application No. 10-2005-0101350, filed on Oct. 26, 2005, in the Korean Intellectual Property Office, the disclosure of which is incorporated herein in its entirety by reference.

BACKGROUND OF THE INVENTION

1. Field of the Invention

The present invention relates to a method of generating and searching for a ternary content addressable memory (TCAM) entry, and more particularly, to a method of generating a single TCAM entry for range search and exact match search and a method and apparatus for searching for a TCAM entry.

2. Description of the Related Art

In general, a ternary content addressable memory (TCAM) is used for simultaneously comparing TCAM entries with each other based on an input key value and finding a matched entry in a predicted time.

A method of searching a TCAM entry includes an exact-match searching method of finding an entry which is exactly matched to a key value and a range searching method for finding an entry having a prefix range corresponding to a key value using a don't care bit x.

Since a range which is not represented in a prefix form using the don't care bit cannot be represented by one TCAM entry, a conversion technology of dividing a range into several TCAM entries and representing the several TCAM entries is used in an application for searching a range except the prefix.

However, since the TCAM is more expensive and has high power consumption than a general memory device, the existing technology of converting the range has low efficiency in a storage space of the TCAM and thus cost unnecessarily increases.

SUMMARY OF THE INVENTION

The present invention provides a method of generating a single TCAM entry for range search and exact match search.

The present invention also provides a method and apparatus for searching for a single TCAM entry through a range searching method and an exact-match searching method.

According to an aspect of the present invention, there is provided a method of generating a TCAM (ternary content addressable memory) entry having upper m bits for range search and lower n bits for exact match search, including (a) determining whether an entry to be added is a range search entry or an exact-match search entry; (b) when the entry is the range search entry, setting a bit at a predetermined position in the upper m bits corresponding to a range represented by the entry to "1" and setting the remaining bits including lower n bits to a "don't care" bit x, based on a range table for representing position information of one of the upper m bits which is set to "1" in ranges; and (c) when the entry is the exact-match search entry, setting the upper m bits to "0" and setting the lower n bits to the entry.

According to another aspect of the present invention, there is provided a method of searching for a TCAM entry including (a) searching a range conversion table composed of $2^n$ m-bit entries which can simultaneously specify an n-bit exact match value and m ranges for an entry using an n-bit lookup value as an index; (b) setting upper m bits of a lookup key to the entry searched from the range conversion table; (c) setting lower n bits of the lookup key to the lookup value; and (d) searching for a TCAM entry using the lookup key.

According to another aspect of the present invention, there is provided an apparatus for searching for a TCAM entry including a range conversion table composed of $2^n$ m-bit entries which can simultaneously specify an n-bit exact match value and m ranges; and a lookup key generating unit which searches the range conversion table for an entry using an n-bit lookup value as an index, sets upper m bits of a lookup key to the searched entry, and sets lower n bits of the lookup key to the lookup value.

Accordingly, a single TCAM entry for range search and exact match search can be generated.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the accompanying drawings.

Figure 1:
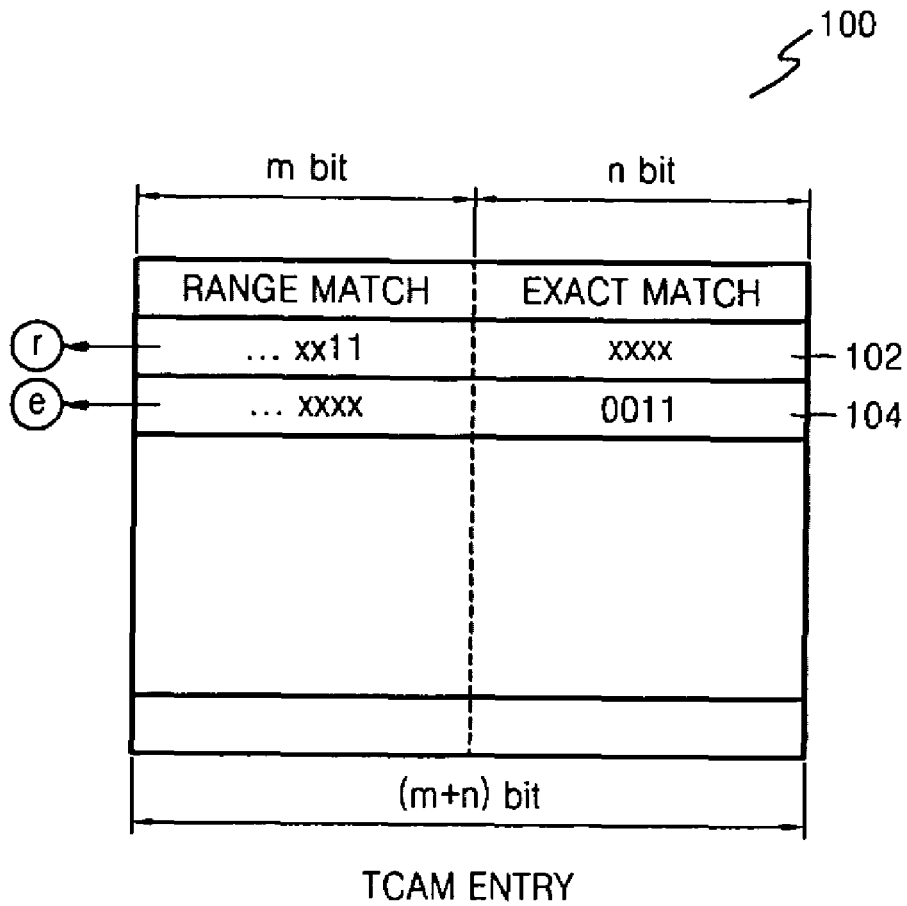
FIG. 1 illustrates a TCAM entry and a range table according to an embodiment of the present invention.

FIG. 1 illustrates a TCAM entry and a range table according to an embodiment of the present invention.

Referring to FIG. 1, in a TCAM entry 100, an n-bit exact-match search entry 104 and an m-bit range search entry 102 are described together. Here, m bits indicating ranges may define at most m different ranges. Therefore, in order to simultaneously search for a key having n bits using an exact-match searching method and a range searching method, a TCAM entry having (n+m) bits is required.

In particular, the TCAM entry 100 according to the present embodiment includes the exact-match search entry 104 and the range search entry 102. In the exact-match search entry 104, upper m bits representing the range are filled with "don't care" bit x and lower n bits define one exact match value. In the range search entry 102, upper m bits are composed of a bit index value defined by a range table 110 and remaining bits including lower n bits are filled with a "don't care" bit x.

For example, in the range table 110, when a first bit of the upper m bits representing the range is set to "1", a range $\alpha_0$ to $\beta_0$ (R[0]) is represented, and, when a second bit of the upper m bits is set to "1", a range $\alpha_1$ to $\beta_1$ (R[1]) is represented. Here, two ranges may overlap each other ($\alpha_1 > \beta_0$).

Figure 2:
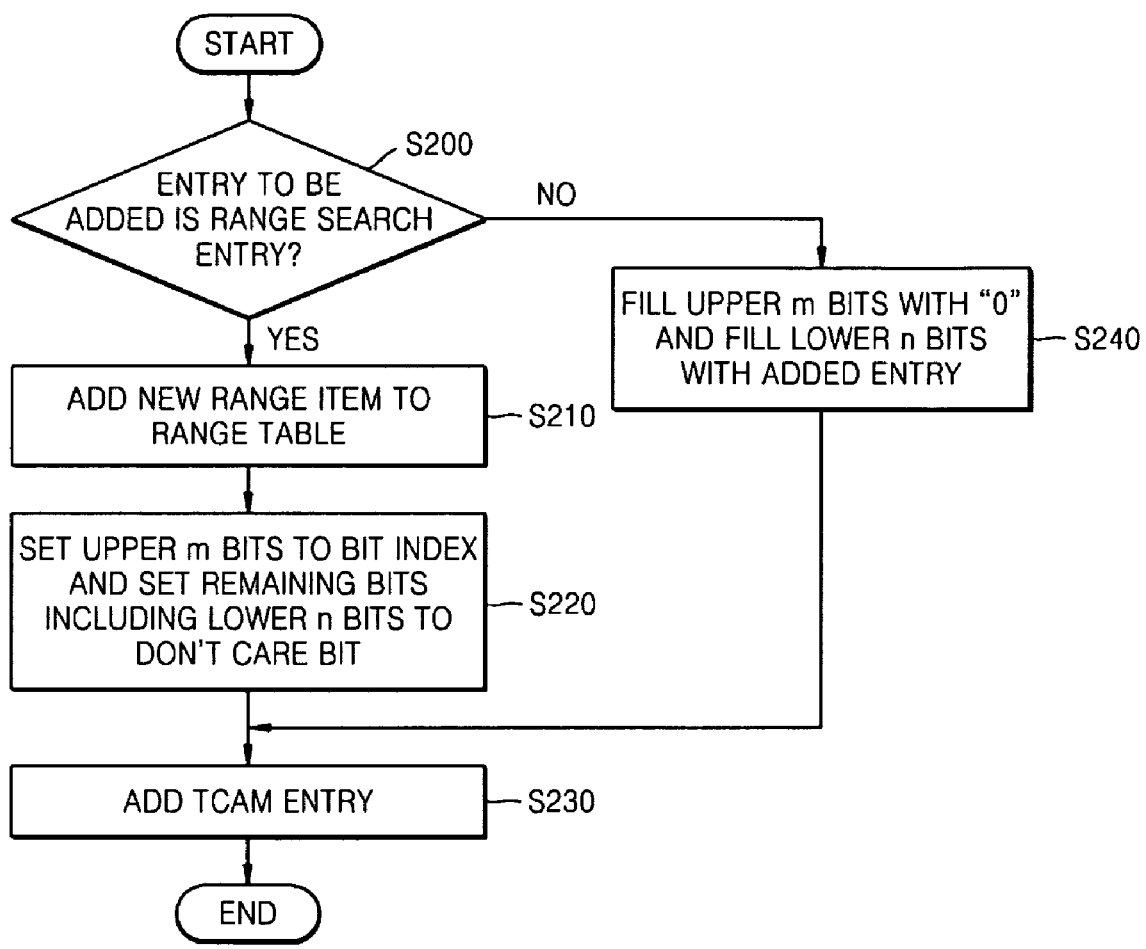
FIGS. 2 and 3 illustrate a method of generating a TCAM entry according to an embodiment of the present invention.
Figure 3:
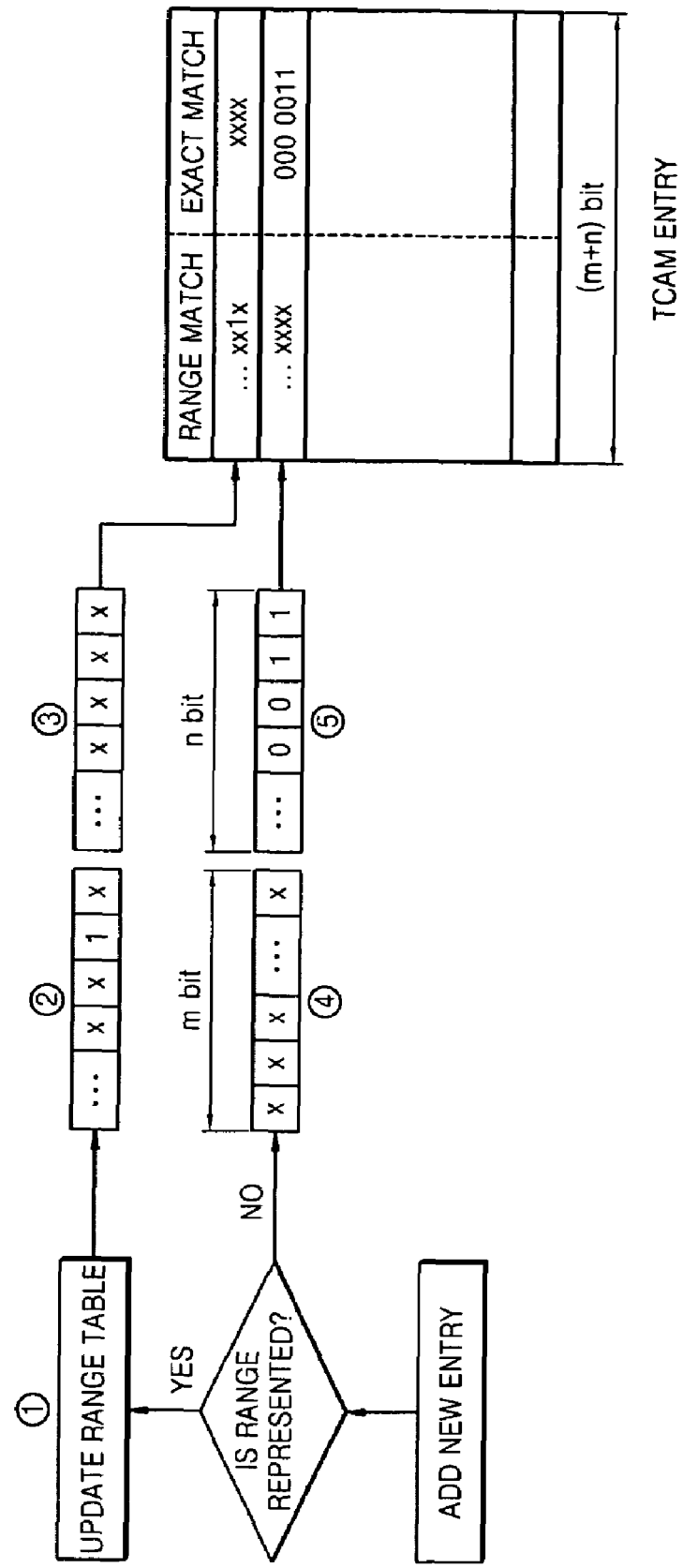

FIGS. 2 and 3 illustrate a method of adding a TCAM entry according to an embodiment of the present invention.

Referring to FIGS. 2 and 3, first, it is determined whether an entry to be added is a range search entry (S200). For example, when the entry includes a start position value and an end position value, if the start position value and the end position value are equal to each other, the entry is determined to the exact-match search entry, and, if the start position value and the end position value are different from each other, the entry is determined to the range search entry.

When the entry to be added is the range search entry, a new range item is added to the range table (See FIG. 1) (S210). Next, the upper m bits are filled with a bit index corresponding to the added range item and the remaining bits including lower n bits are filled with a "don't care" bit x (S220). Then, a new TCAM entry having (m+n) bits is added to the TCAM table (S230).

When the entry to be added is the exact-match search entry, all the upper m bits are filled with "don't care" bit x and the lower n bits are filled with the added entry itself to generate the TCAM entry (S240).

Figure 4:
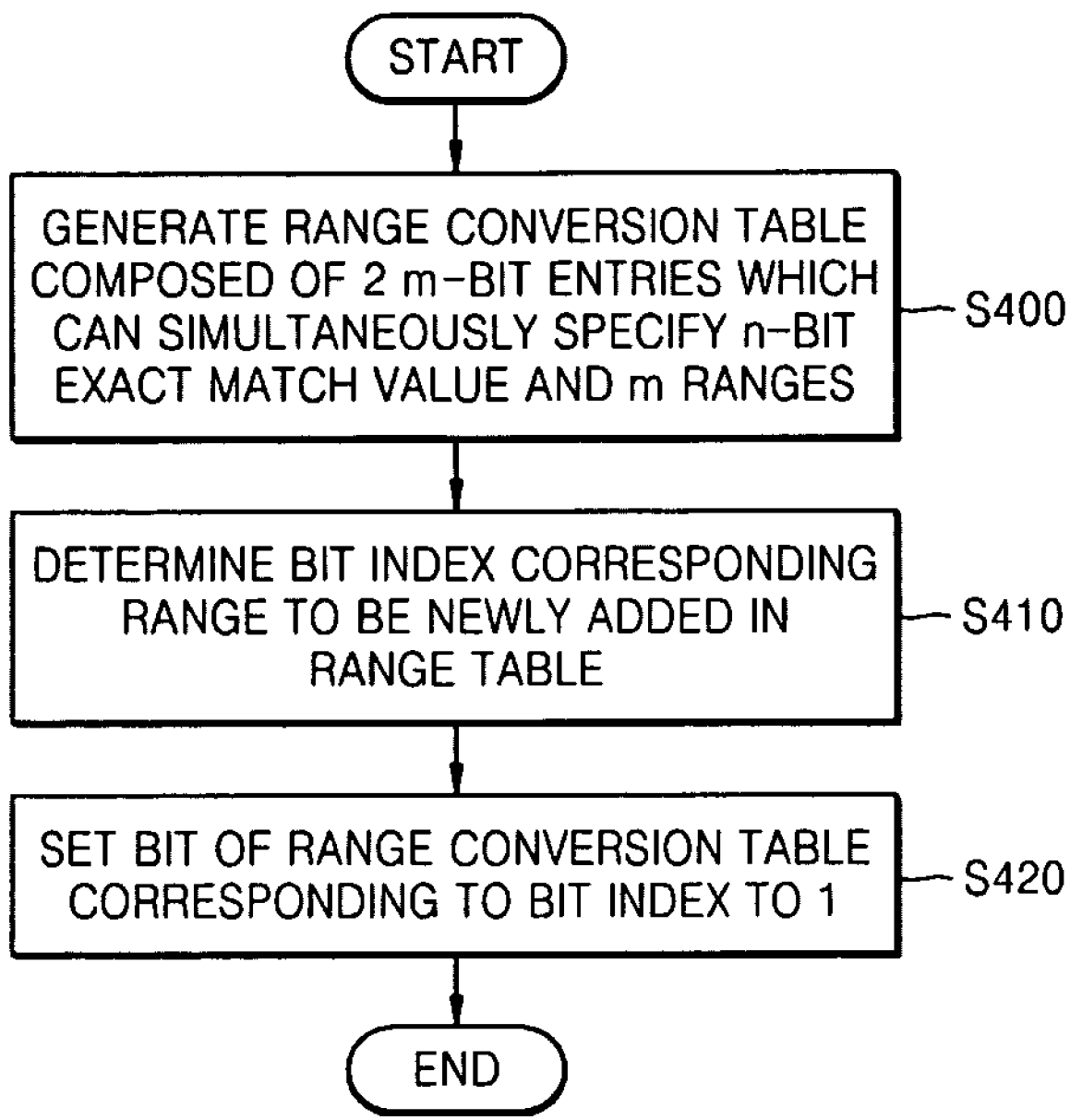
FIGS. 4 and 5 illustrate a method of updating a range conversion table necessary for generating a TCAM lookup key when an entry is newly added, according to an embodiment of the present invention.
Figure 5:
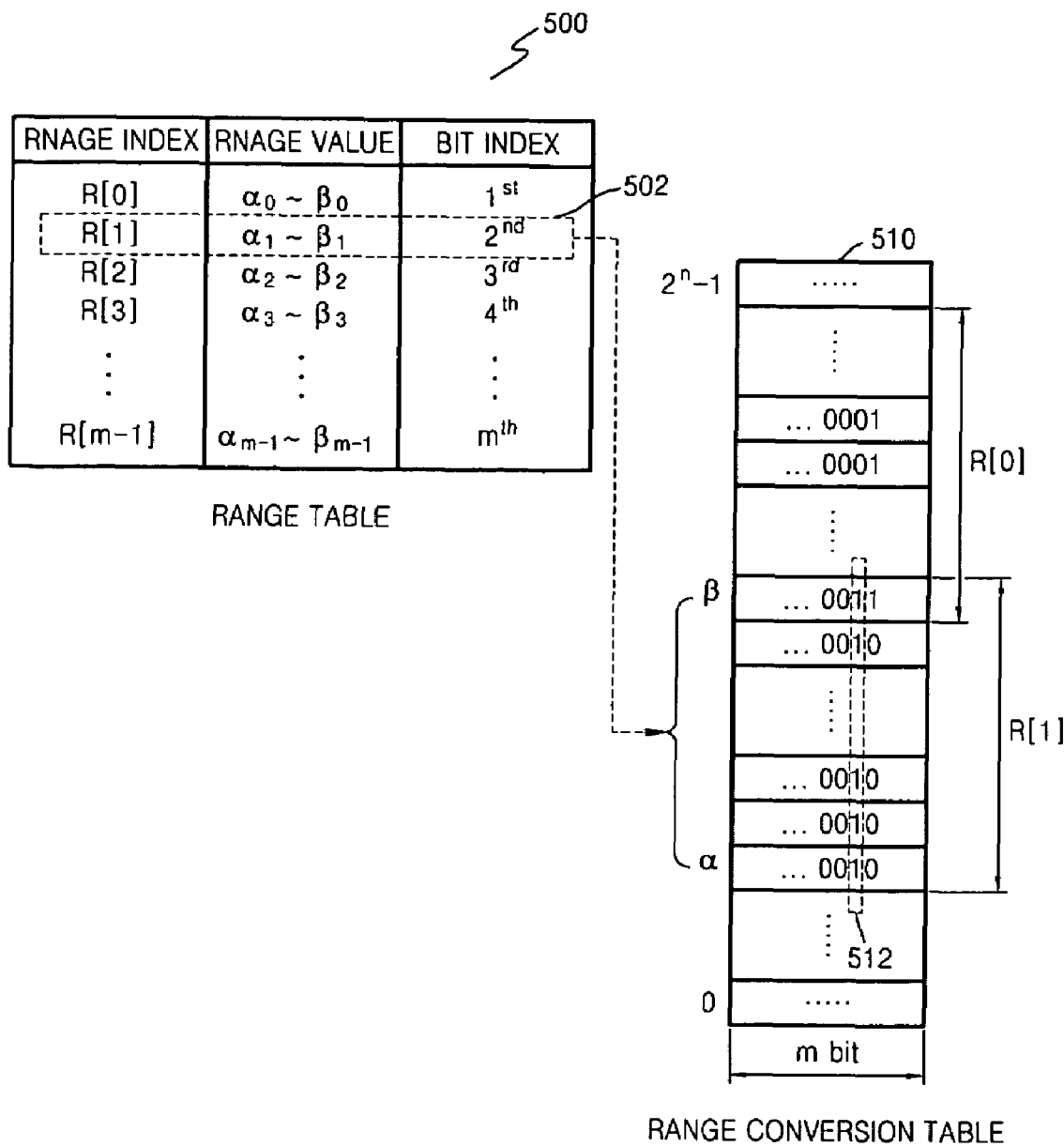

FIGS. 4 and 5 illustrate a method of updating a range conversion table necessary for generating a TCAM lookup key when an entry is newly added, according to an embodiment of the present invention.

Referring to FIGS. 4 and 5, a range conversion table 510 composed of $2^n$ m-bit entries which can simultaneously specify an n-bit exact match value and m ranges is generated (S400). For example, when the range of a range search entry to be newly added is $\alpha_1$ to $\beta_1$ and the entry is added to a second entry 502 in the range table 500, a second bit 512 of the entries in the range conversion table belonging to the range $\alpha_1$ to $\beta_1$ is set to 1, as shown in FIG. 5 (S420).

When a specific range is deleted, an index bit of the entries in the range conversion table belonging to the specific range of the range table is reset to 0.

Figure 6:
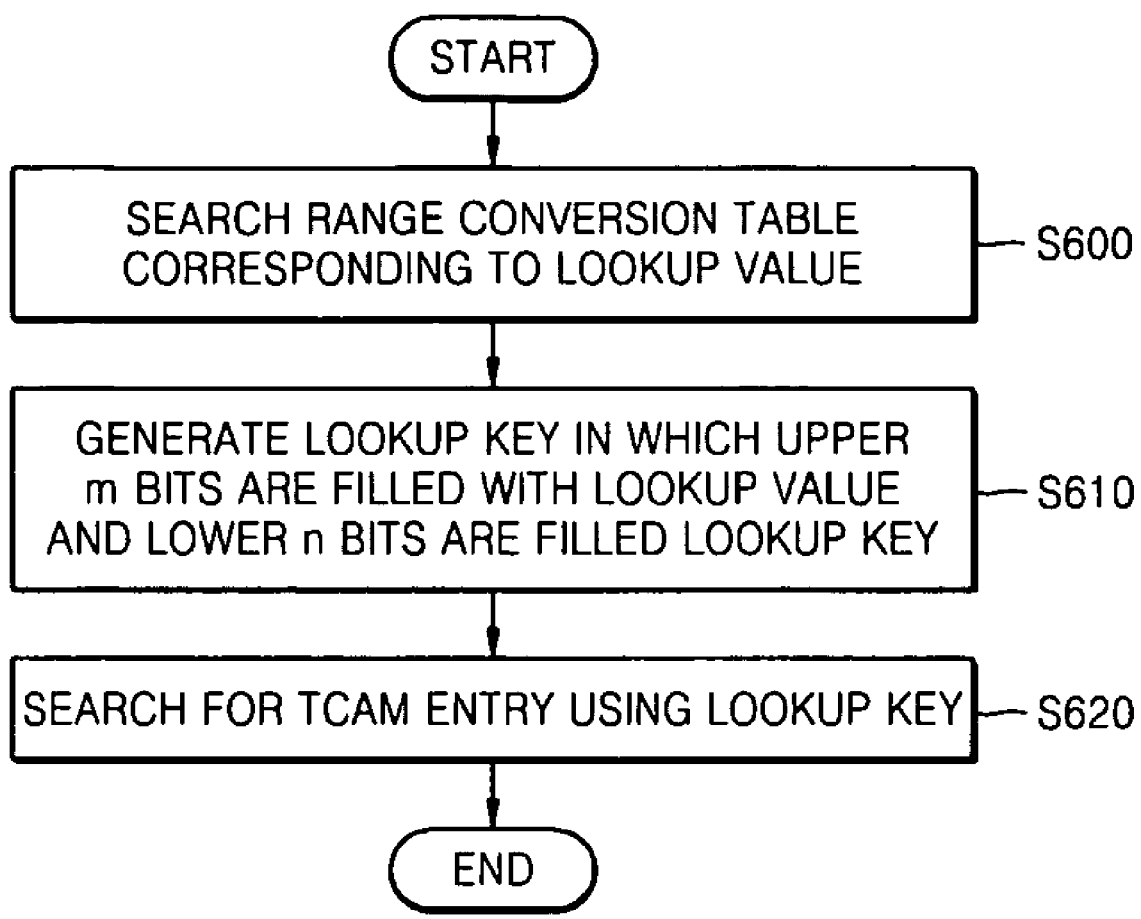
FIGS. 6 and 7 illustrate a method of generating a TCAM lookup key for searching for a TCAM entry using a range conversion table according to an embodiment of the present invention.
Figure 7:
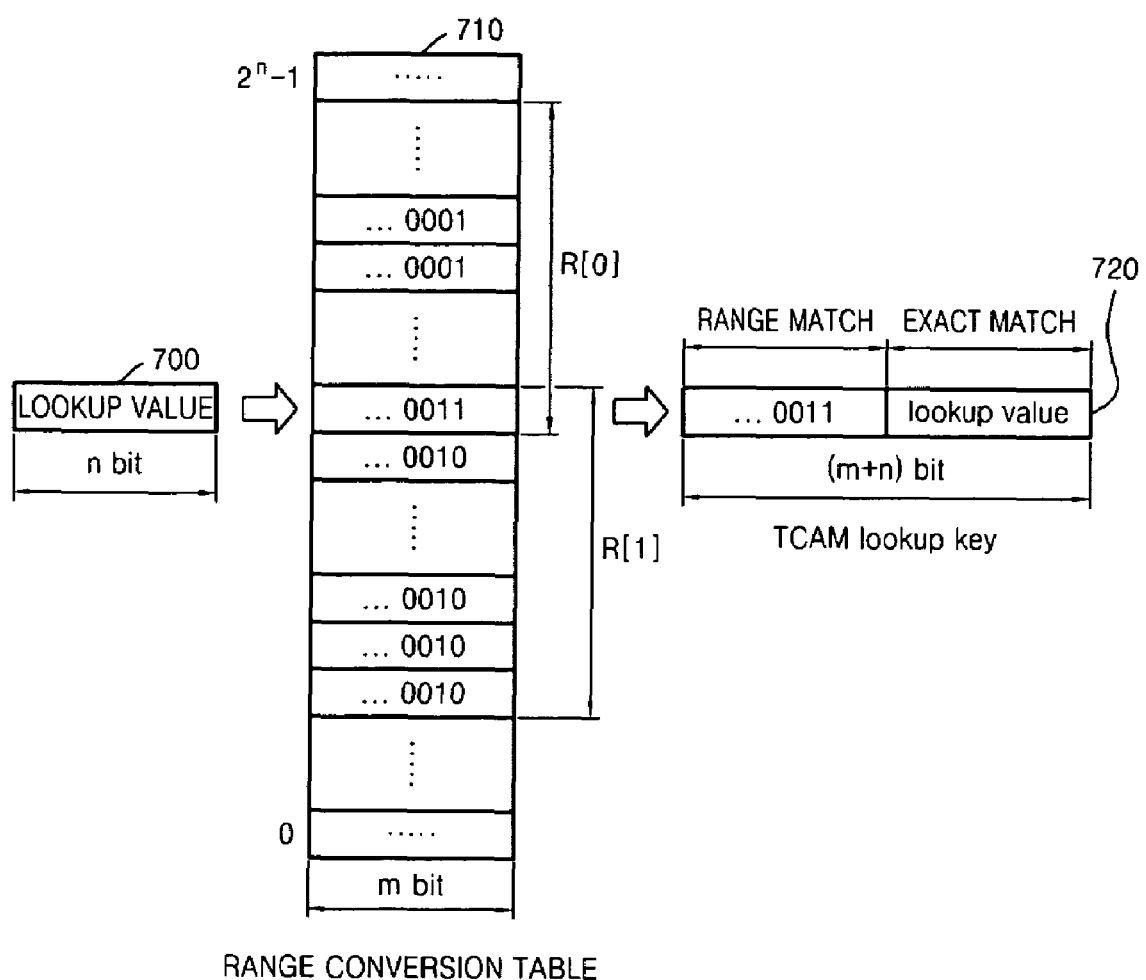

FIGS. 6 and 7 illustrate a method of generating a TCAM lookup key for searching for a TCAM entry using the range conversion table according to an embodiment of the present invention.

Referring to FIGS. 6 and 7, when a lookup value 700 is received for matching, an entry in the range conversion table 710 corresponding to the lookup value 700 is extracted (S600), and the upper m bits are filled with the extracted entry and the lower n bits are filled with the input value itself to generate a TCAM lookup key 720 having (m+n) bits (S610).

Then, a TCAM entry is searched for using the newly generated lookup key (S620). At this time, an exact-match searching method and a range searching method can be simultaneously performed.

Figure 8:
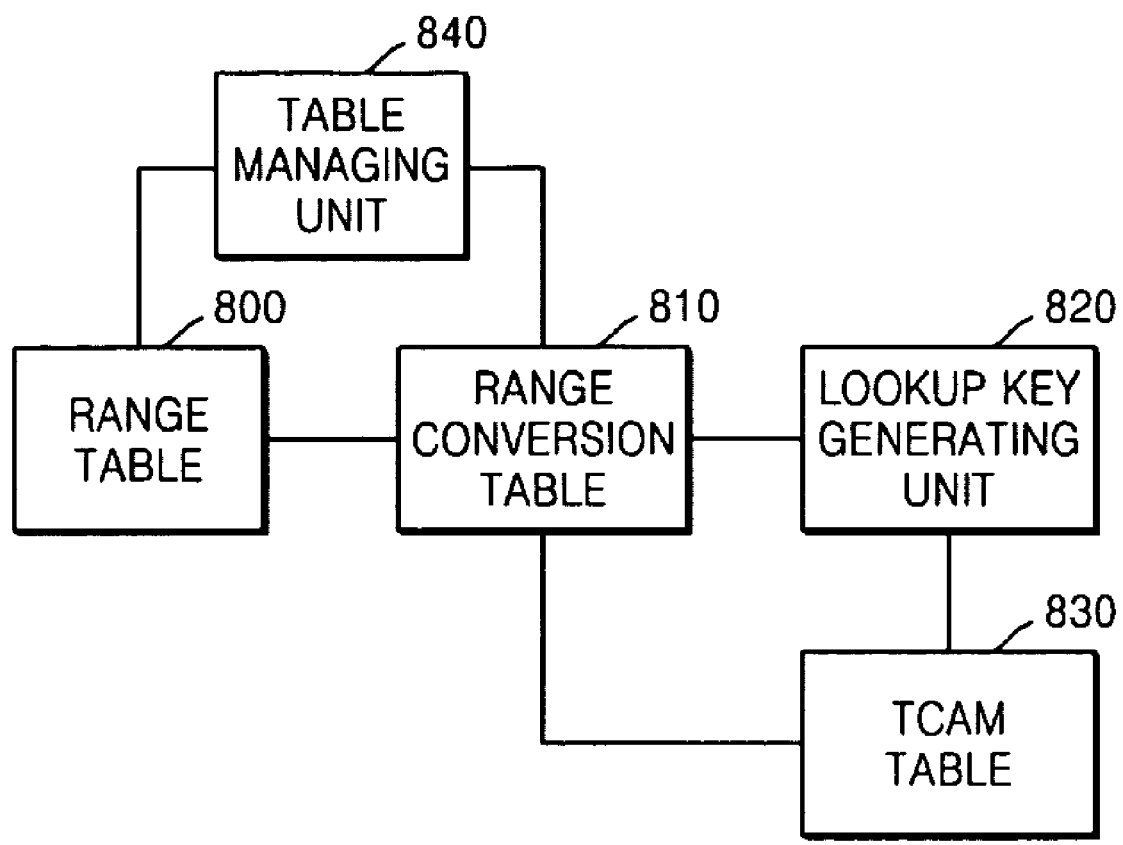
FIG. 8 illustrates a configuration of an apparatus for searching for a TCAM entry according to an embodiment of the present invention.

FIG. 8 illustrates a configuration of an apparatus for searching for a TCAM entry according to an embodiment of the present invention.

Referring to FIG. 8, the apparatus for searching for the TCAM entry includes a range table 800, a range conversion table 810, a lookup key generating unit 820, a TCAM table 830, and a table managing unit 840.

The range table 800 includes position information of a specific bit of m bits which is set to "1" in the respective ranges when m ranges which can overlap each other are represented by m bits.

The range conversion table 810 is composed of $2^n$ m-bit entries which can simultaneously specify an n-bit exact match value and m ranges.

The lookup key generating unit 820 searches the range conversion table for an entry using an n-bit lookup value as an index, fills the upper m bits of a lookup key with the searched entry, and fills the lower n bits of the lookup key with the lookup value.

When a range search entry is added, the table managing unit 840 sets a bit at a predetermined position in the entries of the range conversion table corresponding to the added range based on the range table to "1".

According to the present invention, a range is replaced with a specific bit to generate a new form of a TCAM entry combined with an exact match value. When the TCAM entry is used, one TCAM entry can be used for an exact-match search and a range search.

In addition, since one range is described only using one TCAM entry, an additional TCAM entry is not required and efficiency in a storage space is improved, thereby eliminating unnecessary cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of generating an entry in TCAM (ternary content addressable memory) having upper m bits for range search and lower n bits for exact match search, comprising:
   (a) determining whether the entry to be added is a range search entry or an exact-match search entry;
   (b) when the entry is the range search entry, setting a bit at a predetermined position in the upper m bits corresponding to a range represented by the entry to "1" and setting the remaining bits including lower n bits to a "don't care" bit x, based on a range table for representing position information of one of the upper m bits which is set to "1" in ranges; and
   (c) when the entry is the exact-match search entry, setting the upper m bits to "don't care" bit x and setting the lower n bits to the entry.

2. The method of claim 1, further comprising (d) adding a newly set TCAM entry to a TCAM table.

3. The method of claim 1, wherein the (a) comprises determining that the entry is the exact-match search entry if a start position value and an end position value included in the entry are equal to each other and determining that the entry is the range search entry if the start position value and the end position value are different from each other.

4. The method of claim 1, wherein the range table includes position information of a specific bit of the m bits which is set to "1" in the ranges, when m ranges which can overlap each other are represented by m bits.

5. The method of claim 1, further comprising (e) when the entry is the range search entry, setting a predetermined bit of the entries in a range conversion table corresponding to a range represented by the entry to "1", in the range conversion table composed of $2^n$ m-bit entries which can simultaneously specify an n-bit exact match value and m ranges.

6. A method of searching for a TCAM entry comprising:
   (a) searching a range conversion table composed of $2^n$ m-bit entries which can simultaneously specify an n-bit exact match value and m ranges for an entry using an n-bit lookup value as an index;
   (b) setting upper m bits of a lookup key to the entry searched from the range conversion table;
   (c) setting lower n bits of the lookup key to the n-bit lookup value; and
   (d) searching for the TCAM entry using the lookup key.

7. The method of claim 6, wherein, in the range conversion table, a bit at a predetermined position in entries corresponding to the range is set to "1" when a range search entry is added, and a bit of entries corresponding to a range to be deleted is set to "0" when a range entry is deleted.

* * * * *